(12) United States Patent
Ha

(10) Patent No.: US 8,168,479 B2
(45) Date of Patent: May 1, 2012

(54) RESISTANCE VARIABLE MEMORY DEVICE AND METHOD OF FABRICATING THE SAME

(75) Inventor: Daewon Ha, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 12/717,219

(22) Filed: Mar. 4, 2010

(65) Prior Publication Data

US 2010/0227438 A1  Sep. 9, 2010

(30) Foreign Application Priority Data

Mar. 4, 2009 (KR) .................................. 2009-18488

(51) Int. Cl.
*H01L 21/82* (2006.01)
(52) U.S. Cl. ................................ 438/129; 257/2; 257/4
(58) Field of Classification Search .................. None
See application file for complete search history.

(56) References Cited

U.S. PATENT DOCUMENTS

| | | | |
|---|---|---|---|
| 2006/0003470 A1* | 1/2006 | Chang | 438/3 |
| 2006/0046509 A1 | 3/2006 | Gwan-Hyeob | |
| 2007/0086235 A1* | 4/2007 | Kim et al. | 365/163 |
| 2007/0111487 A1* | 5/2007 | Kim et al. | 438/478 |
| 2007/0114510 A1 | 5/2007 | Sato et al. | |
| 2007/0230237 A1* | 10/2007 | Schwerin et al. | 365/163 |
| 2008/0003815 A1* | 1/2008 | Lee et al. | 438/653 |
| 2008/0048293 A1* | 2/2008 | Horii | 257/536 |
| 2008/0113469 A1* | 5/2008 | Eun et al. | 438/102 |
| 2008/0191188 A1* | 8/2008 | Jeong | 257/4 |
| 2010/0327251 A1* | 12/2010 | Park | 257/2 |

FOREIGN PATENT DOCUMENTS

| | | |
|---|---|---|
| JP | 2006-074028 | 3/2006 |
| JP | 2007-142224 | 6/2007 |
| KR | 2006-1056 | 1/2006 |
| KR | 2006-20514 | 3/2006 |
| KR | 1020090010427 A * | 1/2009 |

* cited by examiner

*Primary Examiner* — Ha Tran T Nguyen
*Assistant Examiner* — Shantanu C Pathak
(74) *Attorney, Agent, or Firm* — Stanzione & Kim, LLP

(57) ABSTRACT

A method of fabricating a resistance variable device includes forming selection devices on a substrate, forming a conductive layer on the selection devices, patterning the conductive layer in a first direction to form conductive patterns spaced apart from each other in the first direction and connecting a pair of adjacent selection devices to each other in the first direction, forming a resistance-variable-material-layer on the conductive patterns, and patterning the resistance-variable-material-layer and the conductive patterns in a second direction to form rows of resistance-variable material extending in the second direction and to form electrodes spaced apart from one another, such that each electrode corresponds to a separate selection device.

13 Claims, 22 Drawing Sheets

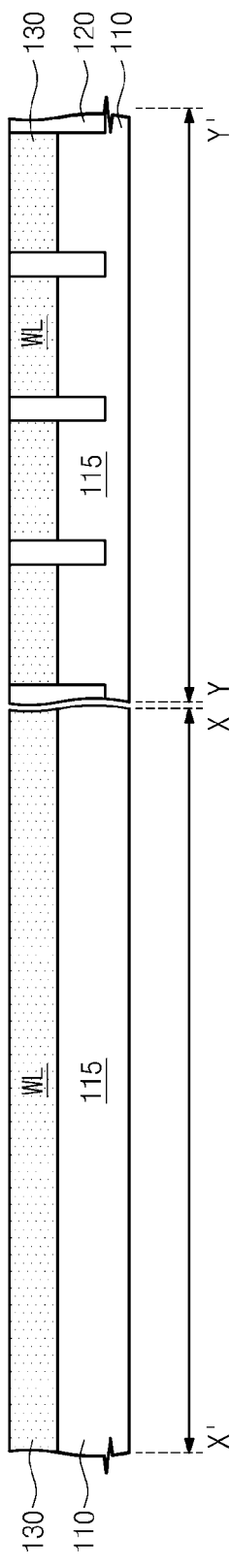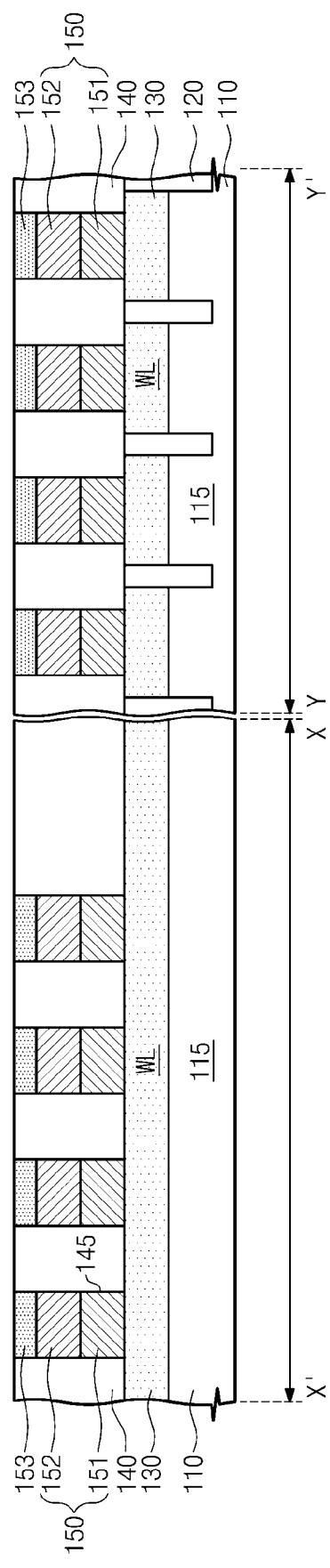

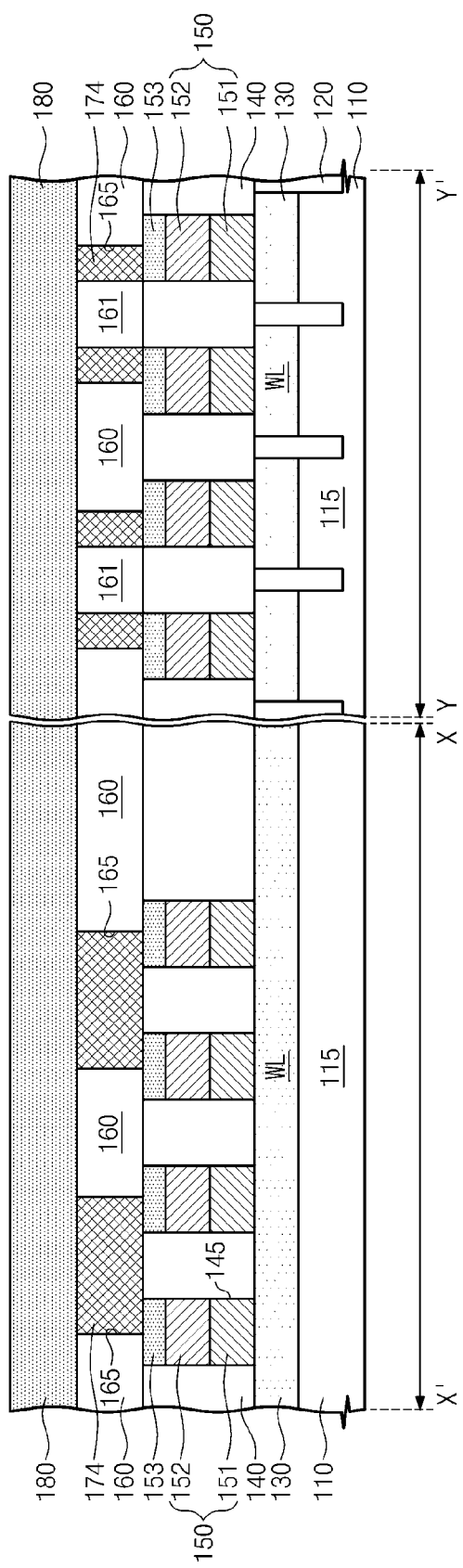

RESISTANCE VARIABLE MEMORY DEVICE AND METHOD OF FABRICATING THE SAME

CROSS-REFERENCE TO RELATED APPLICATIONS

This application claims priority under 35 U.S.C. §119 of Korean Patent Application 10-2009-0018488, filed on Mar. 4, 2009, the entire contents of which are hereby incorporated by reference.

BACKGROUND

1. Field of the Invention

The present disclosure herein relates to a semiconductor device, and more particularly, to a resistance variable memory device and a method of fabricating the resistance variable memory device.

2. Description of the Related Art

Generally, semiconductor memory devices may be classified into volatile memory devices and nonvolatile memory devices. Volatile memory devices lose stored data when power supply is interrupted. Examples of volatile memory devices include Dynamic Random Access Memories (DRAMs) and Static Random Access Memories (SRAMs). Meanwhile, nonvolatile memory devices do not lose stored data even when the power supply is interrupted. Examples of nonvolatile memory devices include Programmable ROMs (PROMs), Erasable PROMs (EPROMs), Electrically EPROMs (EEPROMs), and flash memory devices.

Recently, developments have been actively made on next-generation semiconductor memory devices such as a Ferroelectric Random Access Memory (FRAM), a Magnetic Random Access Memory (MRAM), and a Phase change Random Access Memory (PRAM) in accordance with the tendency toward high performance and low power of the semiconductor memory device. These next-generation semiconductor memory devices are made of materials that vary in resistance according to current or voltage and keep the resistance even though the current or voltage is interrupted.

Of these resistance variable memory devices, the phase change memory device (PRAM) utilizes phase change materials. Therefore, the phase change memory device (PRAM) is rapid in operation speed and has a structure that is advantageous for a high level of integration.

The phase change memory device stores information by using phase change materials. The phase change materials have two stable states (that is, crystalline state and amorphous state) having specific resistances different from each other. The specific resistance of the phase change material in the amorphous state is higher than that of the phase change material in the crystalline state. The phase change memory device can store data in phase change memory cells using the difference in specific resistance according to the state of the phase change material and can read the data stored in the phase change memory cells

SUMMARY

The present disclosure relates to a resistance variable memory device in which electrical characteristics and reliability are improved and a method of fabricating the same.

Additional aspects and utilities of the present general inventive concept will be set forth in part in the description which follows and, in part, will be obvious from the description, or may be learned by practice of the general inventive concept.

Features and/or utilities of the present general inventive concept may be realized by a method of fabricating a resistance variable device, the method including forming selection devices on a substrate, forming a conductive layer on the selection devices, patterning the conductive layer in a first direction to form conductive patterns spaced apart from each other in the first direction and connecting a pair of adjacent selection devices to each other in the first direction, forming a resistance-variable-material-layer on the conductive patterns, and patterning the resistance-variable-material-layer and the conductive patterns in a second direction to form rows of resistance-variable material extending in the second direction and to form electrodes spaced apart from one another, such that each electrode corresponds to a separate selection device.

Features and/or utilities of the present general inventive concept may also be realized by a resistance variable memory device including selection devices and phase change material layer between a substrate and an upper electrode and lower electrodes between the selection devices and the phase change material layer. In this case, the lower electrodes are provided on a polygonal region having vertexes that are located in the vicinity of the center of an upper surface of the selection devices or are the same distance from the center.

Features and/or utilities of the present general inventive concept may also be realized by a resistance-variable memory device including a plurality of diodes formed on a substrate, a resistance-variable material layer connecting at least two diodes of the plurality of diodes, a plurality of lower electrodes connecting the diodes to the resistance-variable material, and at least one upper electrode connected to an upper surface of the resistance-variable material layer.

The plurality of diodes may be arranged in a grid including at least one row and at least two columns.

The resistance-variable material layer may be connected to each diode of two adjacent columns of diodes.

The resistance-variable memory device may further include at least one word line located between the substrate and the plurality of diodes to connect each diode of one row of diodes of the at least one row to each other diode of the one row of diodes.

The resistance-variable memory device may further include a word line contact extending from an upper surface of the resistance-variable memory device to the at least one word line. The at least one word line may be formed by doping the substrate, such that the word line is integral with the substrate.

The at least one upper electrode may be arranged on the resistance-variable material layer to correspond to a location of each diode of one column of diodes of the at least two columns, and the resistance-variable memory device may further include at least one bit line located on the at least one upper electrode arranged to correspond to a location of each diode of the one column of diodes.

The plurality of lower electrodes may include at least four lower electrodes, each corresponding to a separate corner of a polygonal-shaped recess and each connected between the resistance-variable material layer and a separate diode, and each of the at least four lower diodes may be separated by an insulation layer located within the polygonal-shaped recess to contiguously fill a space of the polygonal-shaped recess not occupied by the at least four lower electrodes.

A vertex of each corner of the polygonal-shaped recess corresponds to a center portion of an upper surface of a diode of the plurality of diodes.

The polygonal-shaped recess may correspond to a location of diodes of first and second adjacent columns of diodes, and the resistance-variable material layer may electrically connect diodes of the second column of diodes and a third column of diodes different than the first column.

The resistance-variable material may be a phase-change material layer. A lower surface of each lower electrode may contact an upper surface of a respective diode of the plurality of diodes, and a contacting area of the lower surface of each lower electrode may be less than a surface area of the upper surface of each respective diode.

A lower surface of each lower electrode may contact an upper surface of a respective diode of the plurality of diodes, an upper surface of each lower electrode may contact a lower surface of the resistance-variable material layer, and a surface area of the upper surface of each lower electrode may be less than a surface area of a lower surface of each lower electrode.

Each lower contact may have an "L" cross-section shape such that a base of the "L" contacts the upper surface of a diode and the top of the "L" contacts the resistance-variable material layer.

Each diode may include a silicide layer connected to a lower surface of a respective lower electrode.

The resistance-variable memory device may further include a plurality of word lines arranged parallel to each other on the substrate to form rows and separated from each other by an isolation layer, the plurality of diodes located on and connected to the plurality of word lines, such that each word line may be connected to a plurality of diodes, the diodes separated by a first insulating layer, and the diodes arranged to form a grid including rows corresponding to the word lines and columns, the plurality of lower electrodes connected to the plurality of diodes, such that a lower surface of each lower electrode contacts an upper surface of a respective diode, the plurality of lower electrodes separated by a second insulation layer, the resistance-variable material layer located on the plurality of lower electrodes to connect an upper surface of each lower electrode of two adjacent columns of lower electrodes, a plurality of upper electrodes located on the resistance-variable material layer to form a plurality of columns corresponding to a plurality of columns of the diode grid, a plurality of bit lines located on the plurality of upper electrodes to form a plurality of columns corresponding to the plurality of columns of the upper electrodes.

Features and/or utilities of the present general inventive concept may also be realized by a memory system including a resistance-variable memory device including a plurality of diodes formed on a substrate, a resistance-variable material layer connecting at least two diodes of the plurality of diodes, a plurality of lower electrodes connecting the diodes to the resistance-variable material, and at least one upper electrode connected to an upper surface of the resistance-variable material layer, and a memory controller to control data input to and output from the resistance-variable memory device.

Features and/or utilities of the present general inventive concept may also be realized by a method of fabricating a resistance-variable memory device, the method including forming a plurality of diodes on a substrate, forming a plurality of lower electrodes on the plurality of diodes, respectively, to electrically connect to the plurality of diodes, forming a resistance-variable material layer on the plurality of lower electrodes to electrically connect to the plurality of lower electrodes, and forming a plurality of upper electrodes on the resistance-variable material to electrically connect to the resistance-variable material.

The method may further include forming a plurality of conductive word lines on the substrate and forming the plurality of diodes on the plurality of conductive word lines.

Forming the plurality of conductive word lines includes one of doping the substrate and forming a conductive layer on the substrate.

Forming the plurality of diodes may include forming an insulation layer on the substrate, patterning the insulation layer to form a plurality of recesses to expose portions of the substrate, and forming the plurality of diodes in the plurality of recesses.

Forming the plurality of lower electrodes may include forming an insulation layer on the plurality of diodes, patterning the insulation layer to form recesses to expose portions of upper surfaces of the diodes, and forming the plurality of lower electrodes in the recesses to contact the upper surfaces of the diodes.

Forming the plurality of lower electrodes in the recesses may include forming a conductive layer to fill the recesses, patterning the conductive layer to expose a second insulation layer between the plurality of diodes and to leave portions of the conductive layer at locations corresponding to the upper surfaces of the diodes, and forming a third insulating layer between the remaining portions of the conductive layer.

Forming the plurality of lower electrodes in the recesses may include forming a conductive film on a bottom and sides of the recesses, patterning the conductive film to expose a second insulation layer between the plurality of diodes and to leave portions of the conductive film at locations corresponding to the upper surfaces of the diodes, and forming a third insulating layer between the remaining portions of the conductive film.

Forming the conductive film and patterning the conductive film forms lower electrodes having an "L" cross-section shape in corners of the recesses corresponding to the upper surfaces of the plurality of diodes.

Each of the plurality of recesses may have a polygonal shape having corners corresponding to center portions of upper surfaces of the plurality of diodes.

The diodes may be arranged on the substrate in a grid pattern including rows and columns, and the recesses may be formed to have polygonal shapes having corners corresponding to the center portions of the upper surfaces of the plurality of diodes in first and second adjacent columns of diodes.

The method may further include forming the plurality of lower electrodes in the corners of the recesses, and forming a second insulation layer to contiguously fill the recess. The variable-resistance material layer may be formed to contact upper surfaces of diodes in the second column of diodes and a third column of diodes adjacent to the second column and different from the first column.

Forming the plurality of upper electrodes may include forming a plurality of rows on an upper surface of the resistance-variable material layer, each row corresponding to a row of the plurality of diodes.

The method may further include forming a plurality of conductive word lines on the substrate and forming the plurality of diodes on the plurality of conductive word lines. The plurality of upper electrodes may extend perpendicular to the plurality of conductive word lines.

The method may further include forming a plurality of conductive bit lines on the plurality of upper electrodes, the plurality of conductive bit lines formed in rows on the plurality of upper electrodes to correspond to the rows of the plurality of diodes.

The method may further include forming an insulation layer to separate each bit line from each other bit line and each upper conductive electrode from each other upper conductive electrode.

The method may further include forming a plurality of word line contacts to extend from an upper surface of a respective word line to an upper surface of the resistance-variable memory device.

The plurality of lower electrodes may be formed such that a lower surface of each lower electrode contacts an upper surface of a respective diode, and a surface area of the lower surface of each lower electrode may be less than a surface area of an upper surface of each diode.

The plurality of lower electrodes may be formed such that a lower surface of each lower electrode contacts an upper surface of a respective diode and an upper surface of each lower electrode contacts a lower surface of the resistance-variable material layer, and a surface area of the upper surface of each lower electrode may be less than a surface area of the lower surface of each lower electrode.

BRIEF DESCRIPTION OF THE DRAWINGS

The accompanying drawings are included to provide a further understanding of the present general inventive concept, and are incorporated in and constitute a part of this specification. The drawings illustrate exemplary embodiments of the present general inventive concept and, together with the description, serve to explain principles of the present general inventive concept. In the drawings:

The above and/or other aspects of the present general inventive concept will become apparent and more readily appreciated from the following description of the exemplary embodiments, taken in conjunction with the accompanying drawings, in which:

FIGS. 4 and 5A through 5I are cross-sectional views illustrating a method of forming the resistance variable memory device according to an embodiment of the present general inventive concept;

DETAILED DESCRIPTION OF THE EMBODIMENTS

Figure 1:
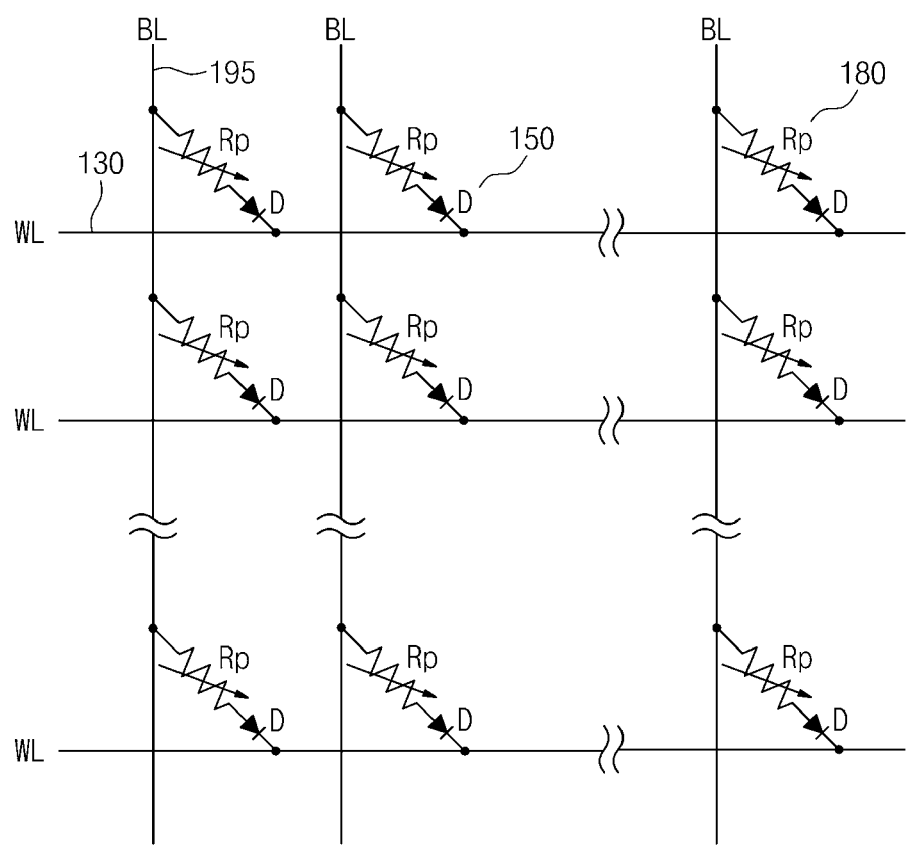
FIG. 1 is an equivalent circuit diagram of a memory cell array in a resistance variable memory device according to embodiments of the present general inventive concept.

Advantages and features of the present general inventive concept and methods of accomplishing the same may be understood more readily by reference to the following detailed description of preferred embodiments and the accompanying drawings. The present general present general inventive concept may, however, be embodied in many different forms and should not be construed as being limited to the embodiments set forth herein. Rather, these embodiments are provided so that this disclosure will be thorough and complete and will fully convey the present general inventive concept to those skilled in the art, and the present general inventive concept will only be defined by the appended claims. Like reference numerals refer to like elements throughout the specification.

It will be understood that when any layers such as a conductive layer, a semiconductor layer, and an insulating layer are referred to as being "on" another material layer or substrate, it may be directly on the other material layer or substrate or intervening elements or layers may be present. In contrast, when an element is referred to as being "directly on," "directly connected to," or "directly coupled to" another element or layer, there are no intervening elements or layers present. It will be understood that, although the terms first, second, etc. are used herein to describe various elements, these elements should not be limited by these terms. These terms are used to distinguish one element from another.

The terminology used herein is for the purpose of describing various embodiments only and is not intended to be limiting of embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations and/or plane illustrations that are schematic illustrations of idealized embodiments of the present general inventive concept. In drawings, the thickness of layers and regions is exaggerated to effectively describe technical details. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of embodiments.

Figure 2:
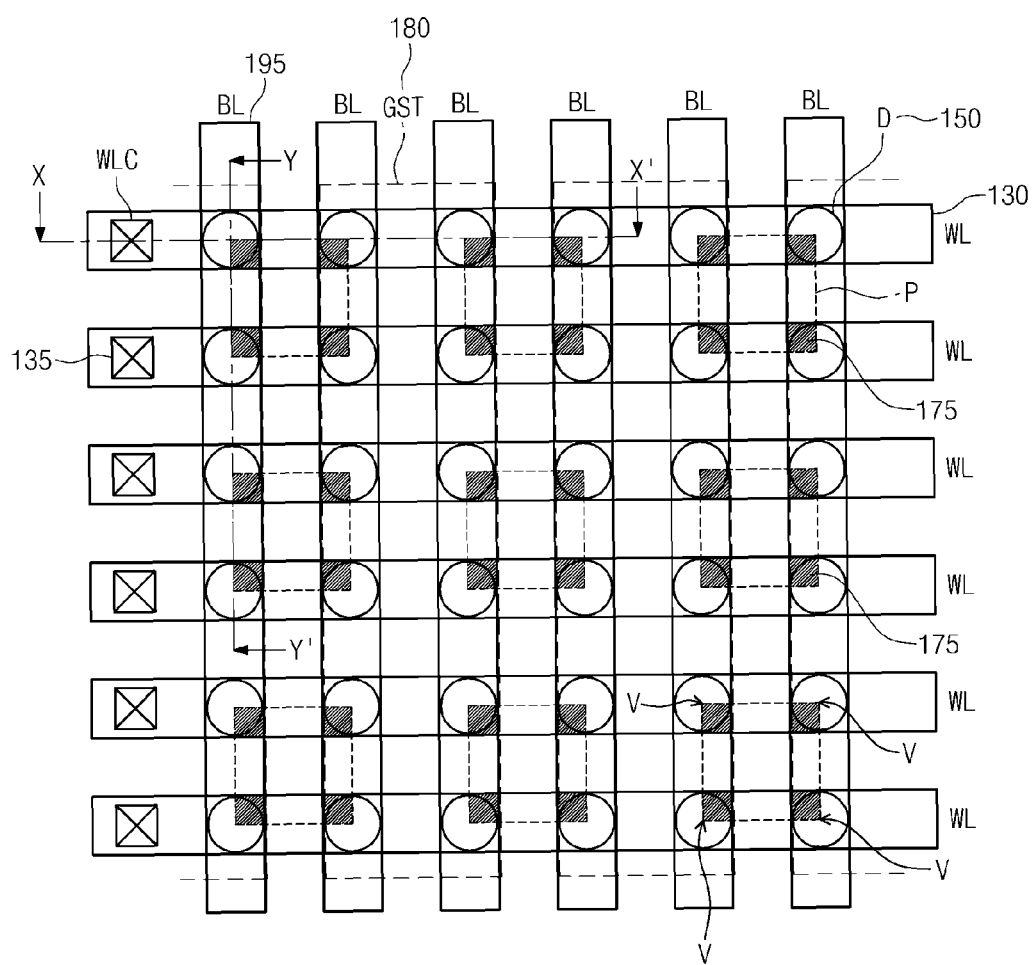
FIG. 2 is a plan view of a memory cell array corresponding to the equivalent circuit diagram of FIG. 1 according to a first embodiment of the present general inventive concept.
Figure 3:
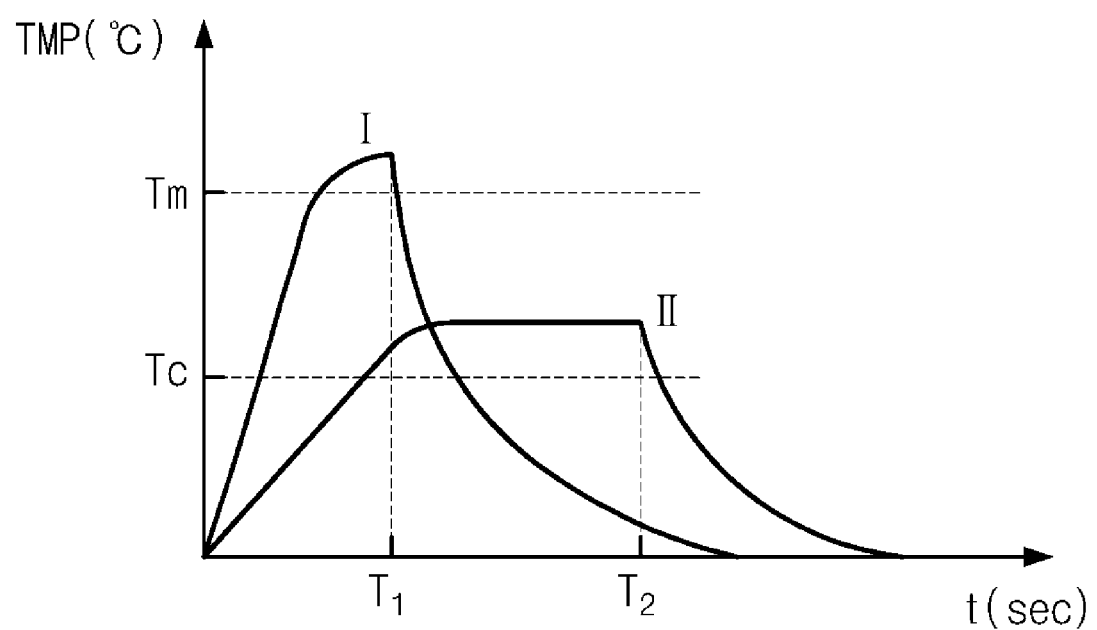
FIG. 3 is a graph illustrating characteristics of phase change materials.

FIG. 1 is an equivalent circuit diagram of a memory cell array in a resistance variable memory device according to embodiments of the present general inventive concept; and FIG. 2 is a plan view of a memory cell array corresponding to the equivalent circuit diagram of FIG. 1. FIG. 3 is a graph explaining characteristics of phase change materials.

Referring to FIGS. 1 and 2, the resistance variable memory device according to the embodiments of the present general inventive concept may include a plurality of bit lines BLs 195, a plurality of word-lines WLs 130 substantially perpendicular to the plurality of bit lines BLs 195, and memory cells defined in parts where the plurality of bit lines BLs 195 intersects with the plurality of word-lines WLs 130. The memory cells may include a resistance variable material 280. The resistance variable material may include phase change materials, such as GST, which is an alloy of germanium, antimony, and tellurium (GeSbTe), in which a crystalline state can reversibly change by applying signals to the material, such as electrical signals of voltage or current, optical signals, or radial rays. The word-lines WLs 130 may electrically be connected to strapping word-lines via word-line contacts WLCs 135.

One end of the resistance variable material is connected to bit-lines BLs 195, and the other end is connected to the word-lines WLs 130 through selection elements 150. A diode or transistor may be used as a selection element for selecting the resistance variable material, but the selection element is not limited thereto.

In FIG. 2, a region 'P' is a recessed region of FIG. 5C that will be described below. As will be described below, the symbol 'GST' indicates a pattern of phase change material layer, and reference numeral '175' indicates a lower electrode. The symbol 'V' indicates a vertex. The vertex refers to a corner point or a point where two sides of the recessed region meet. The symbol 'D' indicates a diode.

FIG. 3 is a graph illustrating a method of programming and erasing the resistance variable material. When the resistance variable material is a phase change material, if the phase change material layer is heated at a temperature higher than a melting temperature Tm for a predetermined time and is then quenched, the phase change material layer is transformed into an amorphous state 'I' (see of FIG. 3). On the other hand, if the phase change material layer is heated at a temperature between the melting temperature Tm and the crystallization temperature Tc for a predetermined time and is then quenched, the phase change material layer is transformed into a crystalline state 'II' (see of FIG. 3). The phase change material layer of the amorphous state has higher specific resistance than the phase change material layer of the crystalline state. Thus, it is possible to determine whether the information stored in the phase change material layer is a logic "1" or a logic "0" by detecting current that flows through the phase change material layer in a read mode. The current required to heat the phase change material to the amorphous state is called the reset current "Ireset". When the reset current is high, it is difficult to effectively supply the current.

Figure 4:
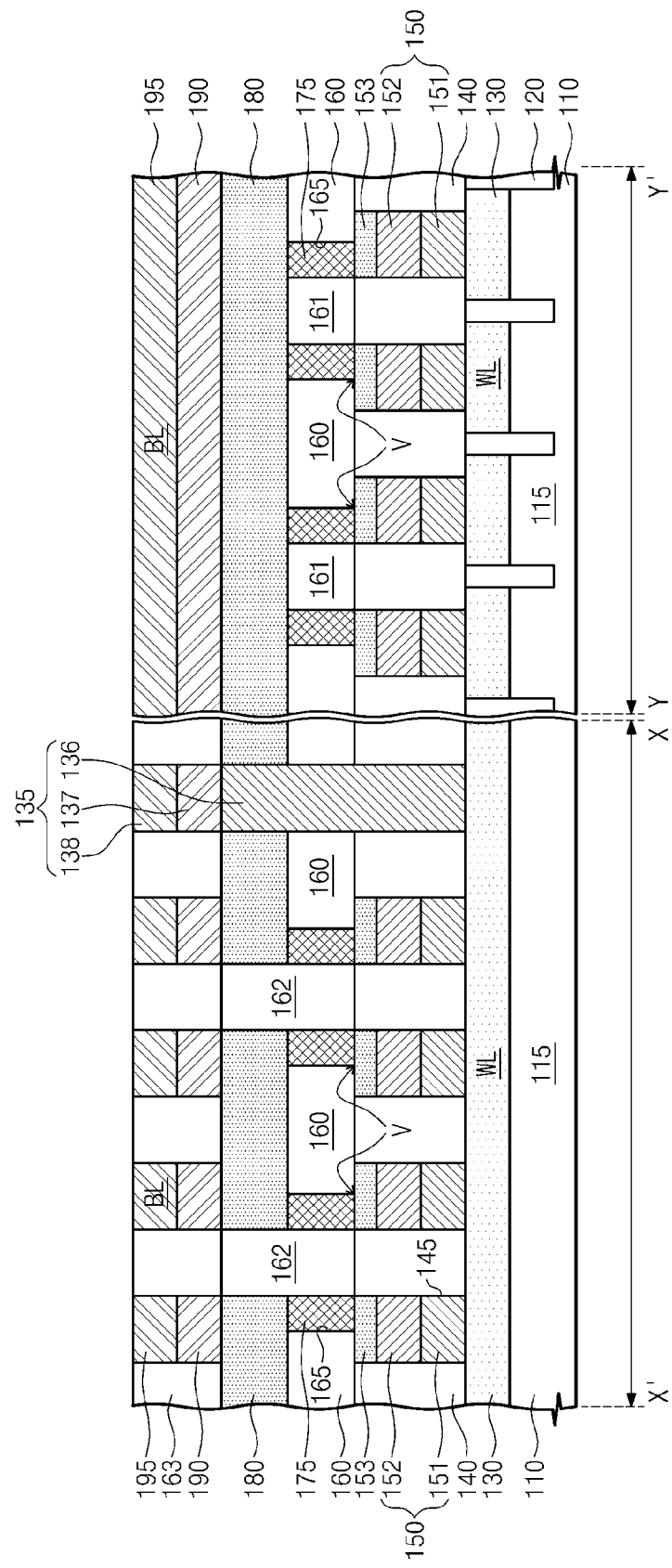

FIG. 4 is a cross-sectional view illustrating the resistance variable memory device according to an embodiment of the present general inventive concept. FIG. 4 illustrates a cross-section of the memory cell array. In order to clearly understand the resistance variable memory device according to this embodiment of the present general inventive concept, FIG. 4 illustrates the cross-sections in both the word-line direction (extending in the direction of the word-line) and the bit-line direction (extending in the direction of the bit-line). In FIG. 4, for instance, a left side is a cross-section in the word-line direction taken along a line X-X' of FIG. 2, while a right side is a cross-section in the bit-line direction taken along a line Y-Y' of FIG. 2.

Referring to FIG. 4, a plurality of word lines (indicated as WL in drawings) 130 may be provided on a substrate 110 in the cell array. Adjacent word lines 130 may electrically be isolated from each other by a device isolation layer 120. A plurality of bit lines (indicated as BL in drawings) 195 intersecting with the word lines 130 may be provided on the substrate 110. For instance, the word lines 130 may be formed of a semiconductor layer doped with impurity ions or a metallic thin film, and the bit lines 195 may be formed of a metallic thin film.

In the cell array, a resistance-variable-material-layer may be provided between the word lines 130 and the bit lines 195 to carry out a memory function. The resistance-variable-material-layer may be a phase change material layer 180. The phase change material layer 180 corresponds to the resistance variable material. The phase change material layer 180 may be formed of compound at least one of Te and Se of chalcogenide materials and at least one selected from Ge, Sb, Bi, Pb, Sn, Ag, S, Si, P, O, and C.

A lower electrode 175 and a selection device are provided between the phase change material layer 180 and the word line 130, and an upper electrode 190 is provided between the phase change material layer 180 and the bit line 195. The lower electrode 175 is electrically connected to the word line 130 through the selection device, for example, a diode 150. The upper electrode 190 is electrically connected to the bit line 195. The lower electrode 175 may be used as a heater for heating the phase change material layer 180. The lower electrode 175 and the upper electrode 190 may be formed of a metallic thin film, such as titanium nitride (TiN) or titanium aluminum nitride (TiAlN). According to the first embodiment of the present general inventive concept, since the lower electrode 175 is partially provided on the diode 150, it is possible to diminish a contact area with the phase change material layer 180, thereby reducing the reset current Ireset.

The selection device, that is, the diode 150 may include N-type semiconductor layer 151 and P-type semiconductor layer 152, which are stacked on the substrate 110, respectively. The P-type semiconductor layer 152 may be in contiguity with the lower electrode 175, and the N-type semiconductor layer 151 may be in contiguity with the word line 130. In this embodiment of the present general inventive concept, the diode 150 penetrates a first insulating layer 140 and may be provided in a first contact hole 145 exposing the word line 130. A silicide layer 153 may be further provided to reduce contact resistance between the diode 150 and the lower electrode 175.

In the cell array, a strapping word line (not illustrated) may be provided at an upper part of the bit line 195. The strapping word line is electrically connected to the word line 130 through a word line contact (indicated as 'WLC' in drawings) 135. The strapping word line is provided to reduce the resistance of the word line 130. The predetermined number of memory cells may be provided between adjacent word line contacts 135. For instance, 8, 16, or 32 memory cells may be provided between adjacent word line contacts 135. The strapping word line may be formed of, for example, a metallic thin film. The word line contact 135 may be formed by stacking a plurality of metal studs 136, 137, and 138, for example, a lower metal stud 136, a middle metal stud 137, and an upper metal stud 138.

FIGS. 5A through 5I are cross-sectional views illustrating a method of forming the resistance variable memory device according to the first embodiment of the present general inventive concept.

Referring to FIG. 5A, a substrate 110 is provided, and a device isolation layer 120 may be formed by processing the substrate 110 to define an active region 115. The substrate 110 may have any semiconductor-based structure with a silicon surface. This semiconductor-based structure may include, for example, a silicon layer, a silicon on insulator (SOI) layer, a silicon germanium (SiGe) layer, a germanium (Ge) layer, a gallium arsenide (GaAs) layer, a doped- or undoped-silicon, or a silicon epitaxial layer supported by a semiconductor structure. The substrate 110 may be P-type silicon substrate doped with P-type impurity. The device isolation layer 120 may be formed, for example, by Shallow Trench Isolation (STI) technique.

A plurality of word lines 130 may be formed on the substrate 110. The word lines 130 may be formed by implanting impurity ions into the active region 115 of the substrate 110. For instance, when the substrate 110 is P-type silicon substrate, the word lines 130 may be formed by implanting N-type impurity ions. Alternatively, the word lines 130 may be formed in various manners. For example, the word lines 130 may be formed by forming a plurality of parallel epitaxial semiconductor layers on the semiconductor substrate 110 and then implanting the impurity ion into the epitaxial semiconductor layers. Moreover, the word lines 130 may be formed by doping with impurities while forming the epitaxial semiconductor layers. As another example, the word lines 130 may be formed of a metallic thin film.

Referring to FIG. 5B, a first insulating layer 140 is formed by depositing an insulating material (e.g., $SiO_2$) on the substrate 110. A first contact hole 145 may be formed by patterning the first insulating layer 140 to expose the plurality of word lines 130. The selection device, that is, the diode 150 may be formed in the first contact hole 145. The diode 150 may be formed by stacking N-type semiconductor layer 151 and P-type semiconductor layer 152. As an example, the diode 150 may be formed by forming a semiconductor layer of germanium, silicon, or silicon germanium in the first contact hole 145 and then implanting impurities into the semiconductor layer. The semiconductor layer formed in the first contact hole 145 may be formed, for example, by a selective epitaxial growth (SEG) or a solid-phase epitaxial growth. The selective epitaxial growth is to grow an epitaxial layer by utilizing the word line 130 exposed by the first contact hole 145 as a seed layer. Meanwhile, the solid-phase epitaxial growth is to form an amorphous or polycrystalline semiconductor layer in the first contact hole 145 and then to crystallize the amorphous or polycrystalline semiconductor layer. According to the first embodiment of the present general inventive concept, the diode 150 may be formed by the selective epitaxial growth (SEG). A silicide layer 153 may be further formed on the diode 150. The silicide layer 153 can reduce a contact resistance between the diode 150 and a lower electrode that will be described below. The silicide layer 153 may be formed of a metal silicide such as cobalt silicide, nickel silicide, or titanium silicide.

Figure 5C:
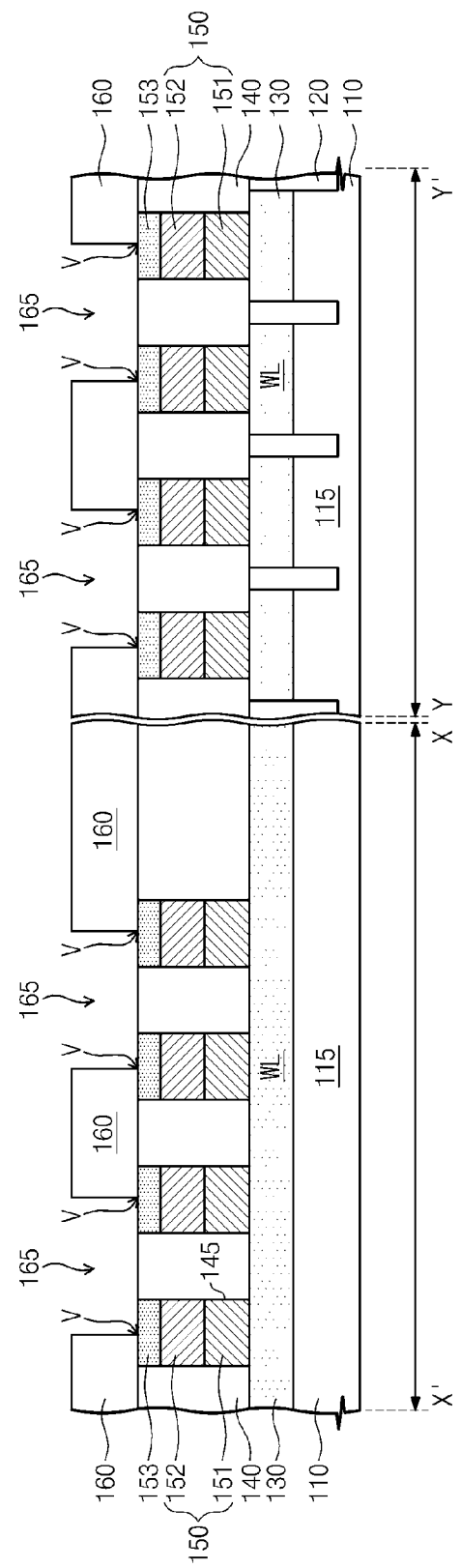

Referring to FIG. 5C, a second insulating layer 160 may be formed by depositing an insulating material on the diode 150 and the first insulating layer 140 and patterning the diode 150 and the first insulating layer 140. The second insulating layer 160 may include an oxide layer, a nitride layer, or oxynitride layer. The patterning process is patterned in a first direction and in a second direction intersecting the first direction and may form recessed regions 165. According to the first embodiment of the present general inventive concept, the recessed regions 165 formed by the patterning process may have the same shape as the region 'P' of FIG. 2.

The region 'P' may be a shape in which each vertex 'V' of a transverse section of the recessed region 165 exists on the diode 150. This means that the vertexes 'V' of the transverse section of the recessed region 165 may be provided on the diode 150 adjacent to recessed region 165 regardless of shapes of the transverse section of the recessed region 165. The vertexes 'V' may be located at the center of the diode 150, as illustrated in FIG. 2. Alternatively, the vertexes 'V' may be the same distance from the center of the diode 150. As discussed above, the vertex 'V' refers to a corner or point where two sides of the recessed region 165 meet. In FIGS. 2, 4, and 5C-5I, the vertex 'V' is a corner of a square-shaped recessed region 165 that is located over a center of a diode 150. However, the recessed region 165 may be of any shape, such as a circle or oval, and a line connecting two vertices 'V' may be straight or curved. For example, if the recessed region were to have a circular shape, the vertex 'V' would refer to a point above a diode 150 closest to a center of the diode where a side wall of the recessed region 165 connected to the bottom of the recessed region 165.

Figure 5D:
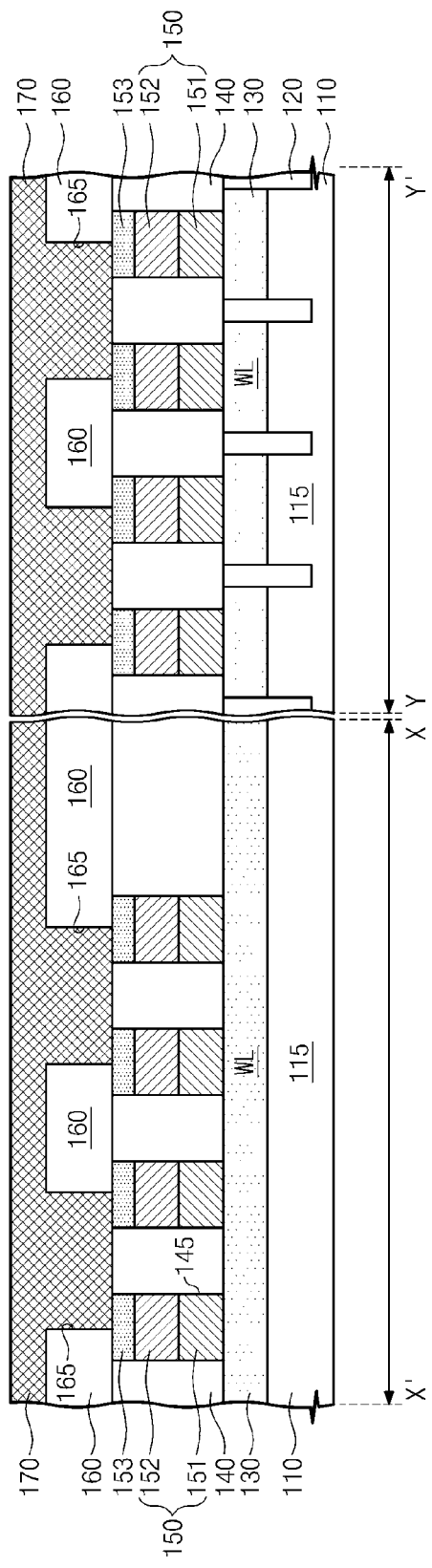

Referring to FIG. 5D, a conductive layer 170 may be formed on the recessed region 165 and the second insulating layer 160. The conductive layer 170 may be formed of at least one selected from transition metals, conductive transition metal nitrides, and conductive ternary nitrides. The conductive layer 170 may be formed by a sputtering or a Plasma-Enhanced Chemical Vapor Deposition (PECVD). After the conductive layer 170 is formed, a Chemical-Mechanical Polishing (CMP) may further be provided.

Figure 5E:
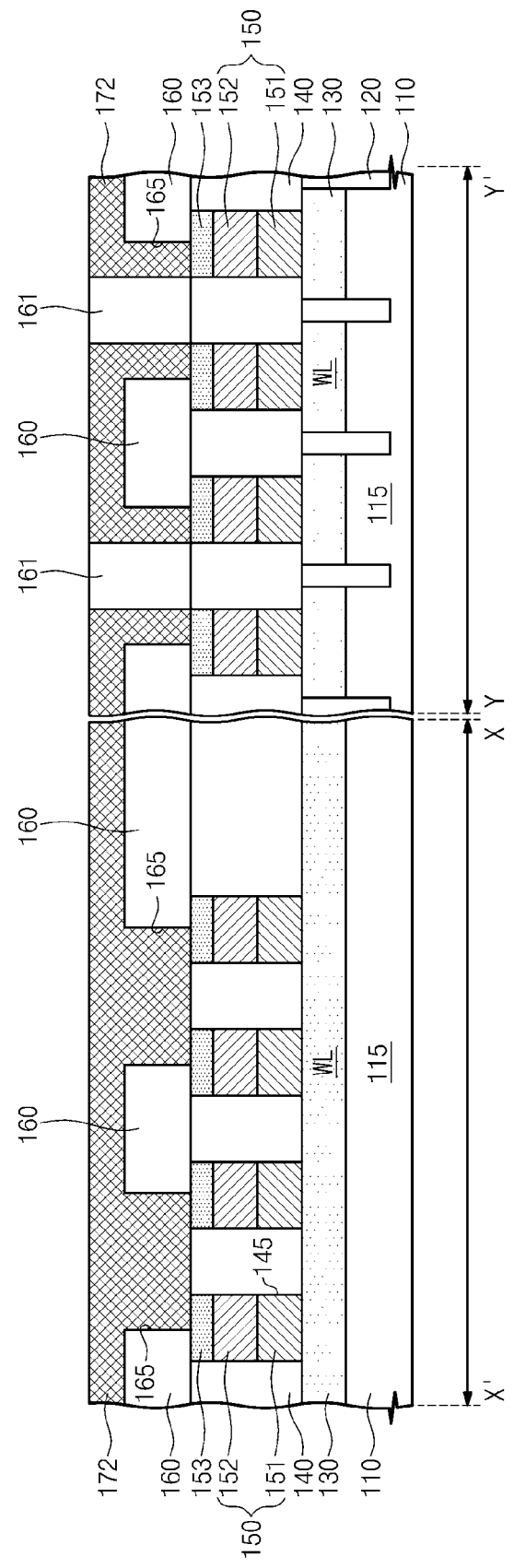

Referring to FIG. 5E, a preliminary conductive pattern 172 may be formed by patterning the conductive layer 170 in a first direction. The first direction may be a direction parallel to the X-X direction. The patterning in the first direction means the process of patterning by a photo mask to have a repetitive pattern in a direction (Y-Y direction) perpendicular to the first direction. The patterning in the first direction may be a photolithography process. According to an embodiment of the present general inventive concept, a plurality of preliminary conductive patterns 172 may be formed to correspond to respective pairs of adjacent diodes by the patterning in the first direction. The patterning in the first direction makes it possible to overcome minimum pitch restrictions of photolithographic processes. For example, in FIG. 5E, the portions of the preliminary conductive pattern 172 located on either side of the second insulating layer 160 may have a width that is less than a possible width if a patterning process were performed without a semiconductor layer 160 being present. The patterning in the first direction may be performed by a fluorokrypton (KrF) laser. A third insulating layer 161 may be formed in the recessed region provided by the patterning in the first direction.

Figure 5F:
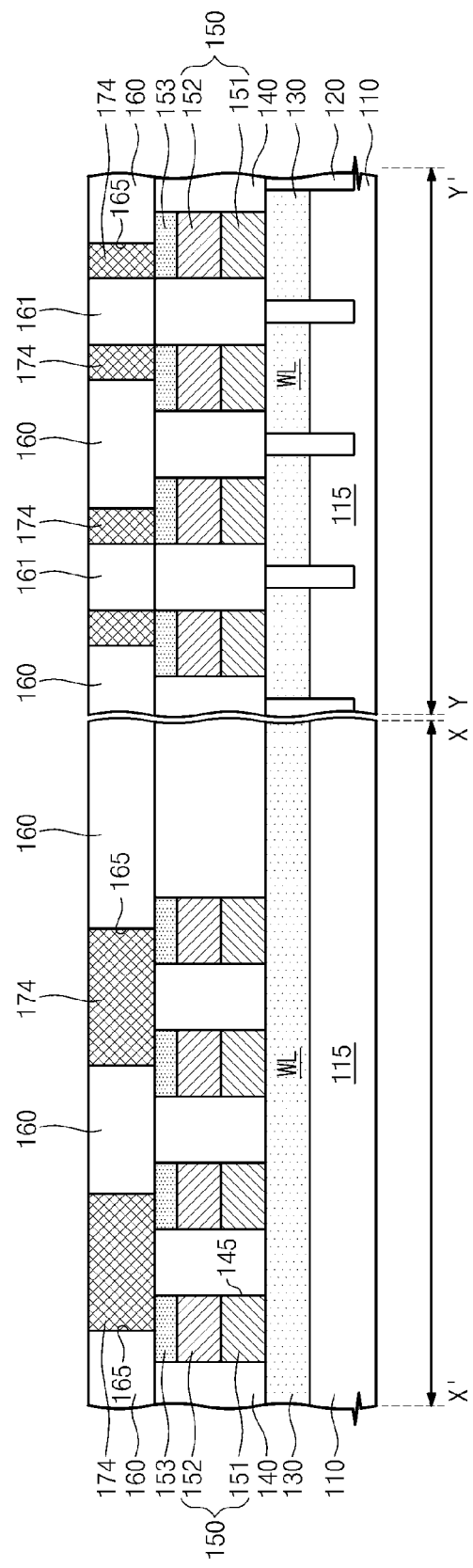

Referring to FIG. 5F, a chemical-mechanical polishing (CMP) process may be performed to form a conductive pattern 174 by separating the portions of the preliminary conductive pattern 172 corresponding to the electrically-connected pairs of adjacent diodes.

Referring to FIG. 5G, the resistance-variable-material-layer, for example, the phase change material layer 180, may be formed on the conductive pattern 174 and the second insulating layer 160. The phase change material layer 180 may be a material capable of changing phases, such as from liquid to solid or vice versa. The phase change material layer 180 may be formed of compounds of at least one of Te and Se of chalcogenide materials and at least one selected from Ge, Sb, Bi, Pb, Sn, Ag, S, Si, P, O, and C.

Figure 5H:
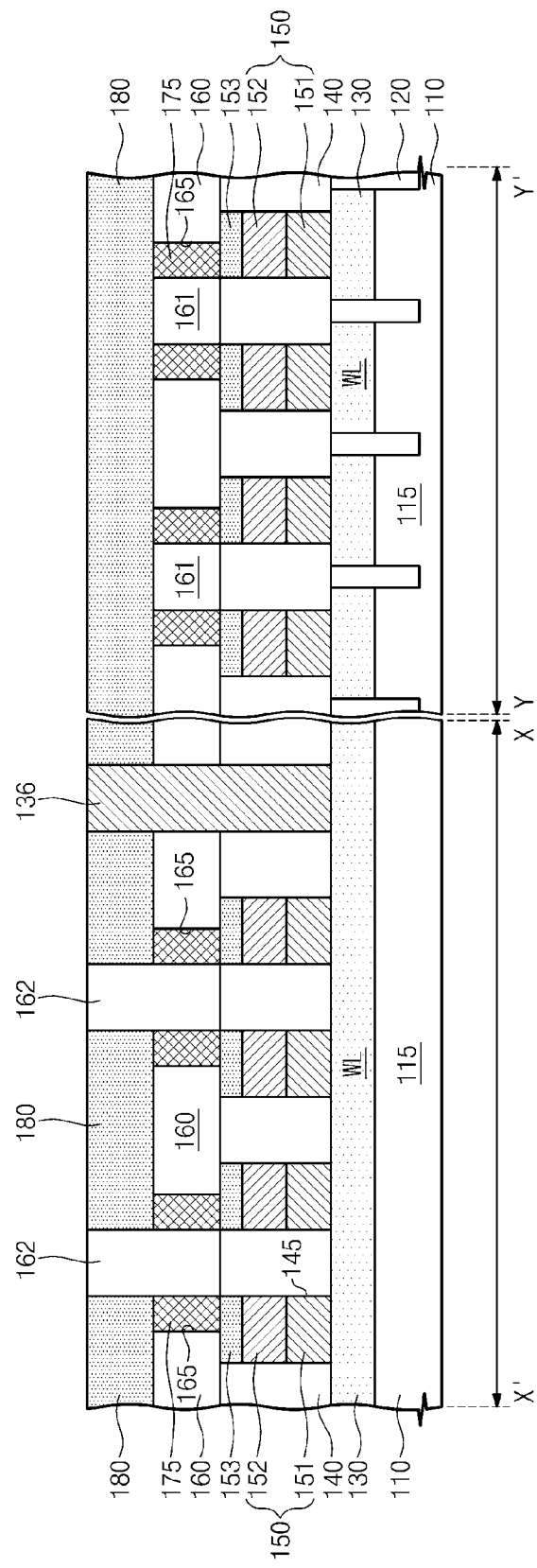

Referring to FIG. 5H, the phase change material layer 180 and the conductive pattern 174 may be patterned in a second direction. The second direction may be a direction parallel to the Y-Y direction. The patterning in the second direction means the process of patterning by a photo mask to have a repetitive pattern in a direction (X-X direction) perpendicular to the second direction. The patterning in the second direction may be a photo process. By the patterning in the second direction, the lower electrode 175 may separately be formed on each diode 150. A plurality of lower electrodes 175 may formed corresponding to portions of the conductive pattern connecting adjacent diodes by the patterning in the second direction. As discussed previously, the patterning process may be used to overcome minimum pitch requirements of photolithographic processes. For example, a conventional photolithographic process may not be able to efficiently or consistently form a lower electrode 175 having a width illustrated in FIG. 5H, but the patterning process of the portions of the conductive pattern 174 adjacent to the second insulation layer 160 may result in a thinner lower electrode 175. A fourth insulating layer 162 may be formed in the recessed region provided by the patterning in the second direction. A contact hole is formed by patterning the phase change material layer 180, the second insulating layer 160, and the first insulating layer 140. Subsequently, a lower metal stud 136 may be formed in the contact hold.

Figure 5I:
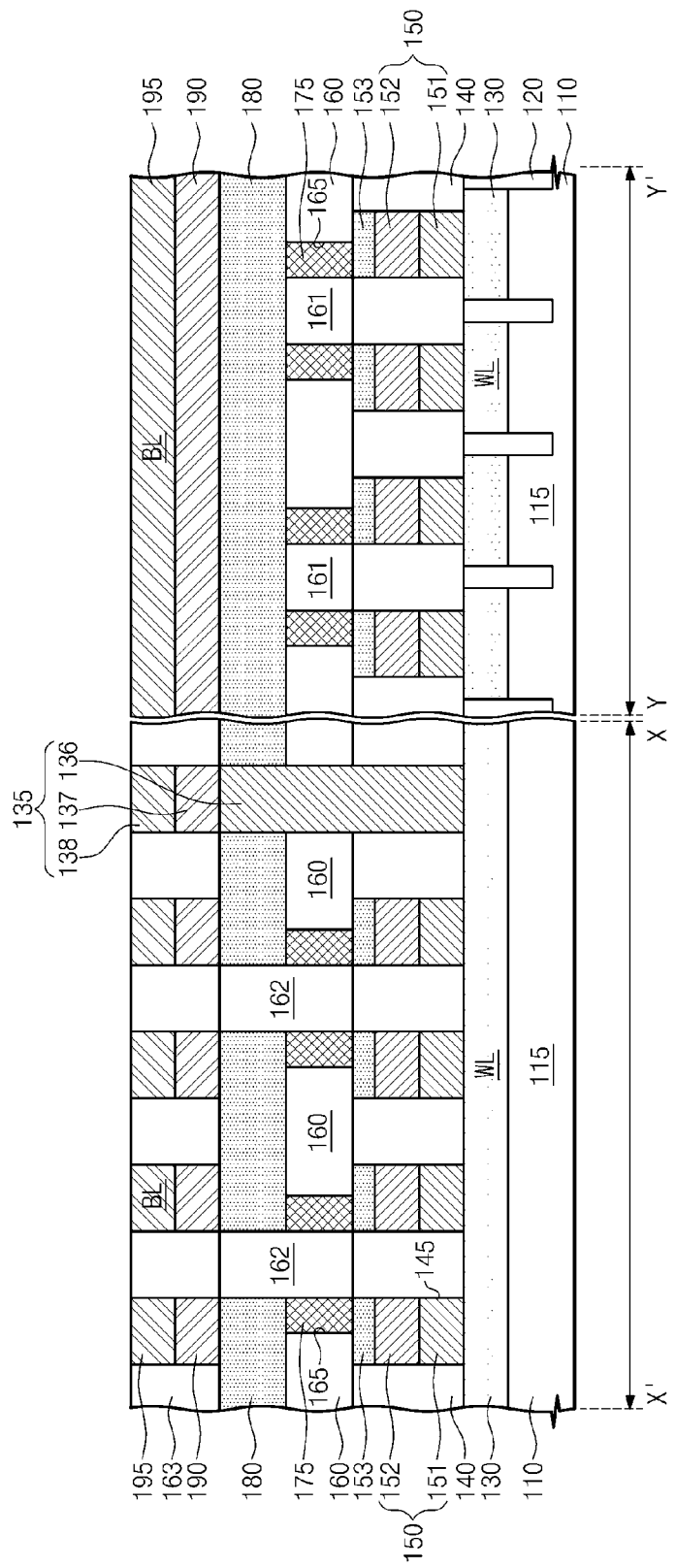

Referring to FIG. 5I, an upper electrode 190 and a bit line 195 may be formed on the phase change material layer 180. According to the first embodiment of the present general inventive concept, a fifth insulating layer 163 in formed on the phase change material layer 180 and the fourth insulating layer 162. After the fifth insulating layer 163 is patterned, the conductive layer, the upper electrode 190, and the bit line 195 may sequentially be formed. The upper electrode 190 may have the same material as the lower electrode 175. The bit line 195 may be formed of a metallic thin film. According to the first embodiment of the present general inventive concept, the bit line 195 may be formed by a sputtering. In addition, an upper metal stud 138 and a middle metal stud 137 may be formed in the same manners as described above.

The memory device according to the first embodiment of the present general inventive concept diminishes the contact area between the phase change material layer 180 and the lower electrode 175, thereby reducing the reset current Ireset.

Figure 6:
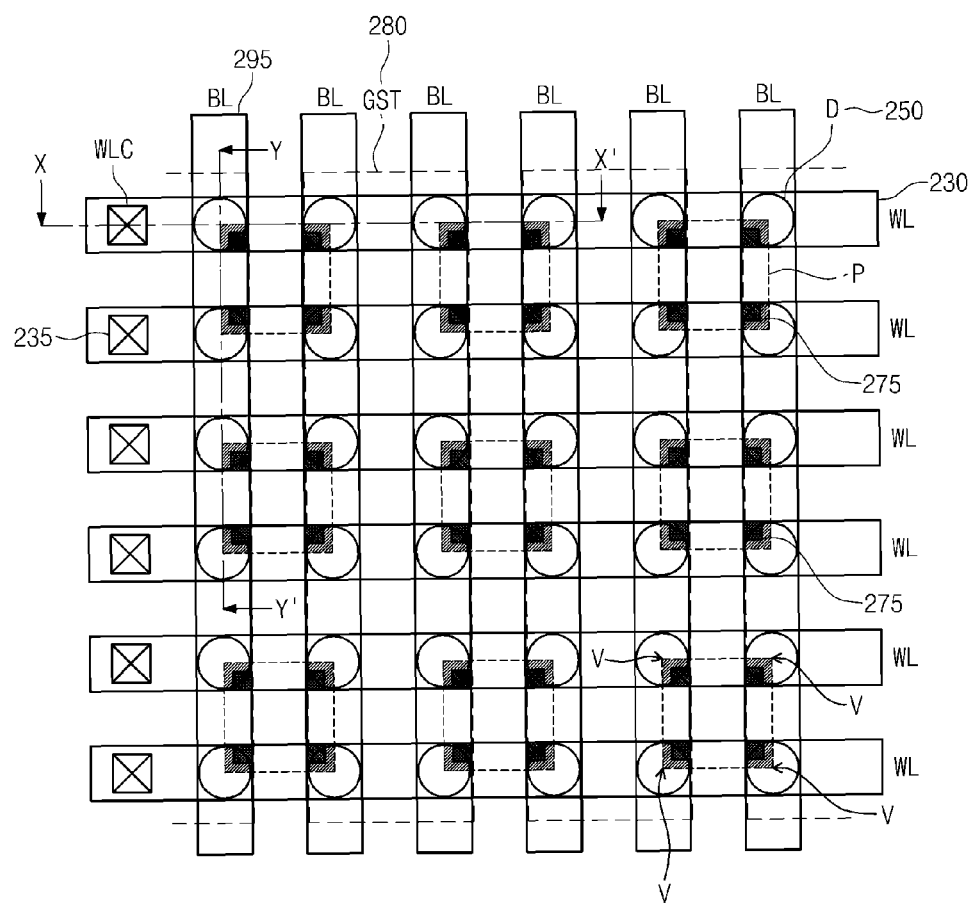
FIG. 6 is a plan view of a memory cell array corresponding to the equivalent circuit diagram of FIG. 1 according to another embodiment of the present general inventive concept.

FIG. 6 is a plan view of a memory cell array corresponding to the equivalent circuit diagram of FIG. 1 according to another embodiment of the present general inventive concept.

In FIG. 6, a region 'P' is a recessed region of FIG. 8A that will be described below. As will be described below, the symbol 'GST' indicates a pattern of phase change material layer, and reference numeral '275' indicates a lower electrode. The symbol 'V' indicates a vertex. The symbol 'D' indicates a diode. Other components may be the same as described with reference to FIG. 2.

FIGS. 7 and 8A through 8G are cross-sectional views illustrating a method of forming the resistance variable memory device according to another embodiment of the present general inventive concept. This embodiment of the present general inventive concept is similar to the first embodiment of the present general inventive concept except for a form of the lower electrode. Accordingly, with respect to the duplicated technical features, the description will be omitted below for brevity.

Figure 7:
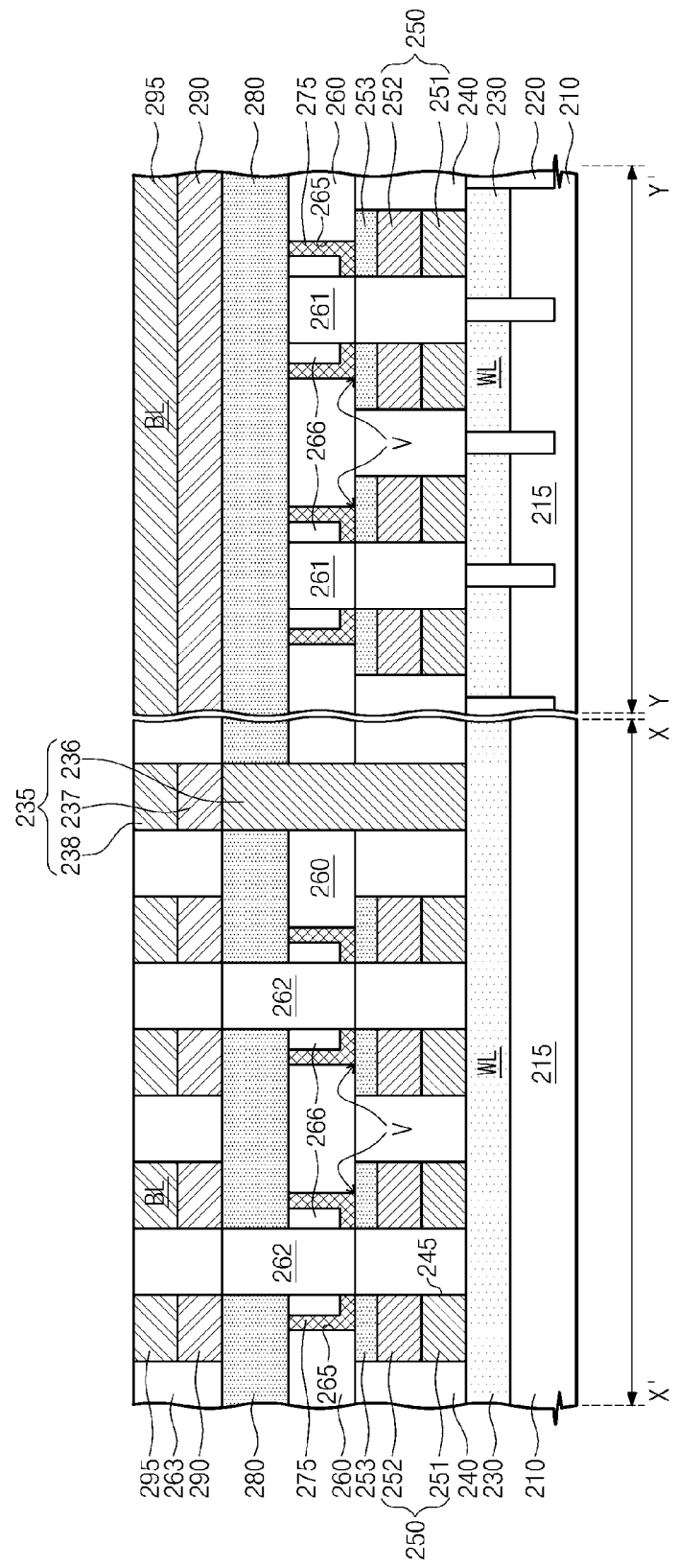
FIGS. 7 and 8A through 8G are cross-sectional views illustrating a method of forming the resistance variable memory device according to another embodiment of the present general inventive concept.

Referring to FIG. 7, a plurality of word lines (indicated as WL in drawings) 230 may be provided on a substrate 210 in the cell array. The substrate may have an active region 215. Adjacent word lines 230 may be electrically isolated from each other by a device isolation layer 220. A plurality of bit lines (indicated as BL in drawings) 295 intersecting the word lines 230 may be provided on the substrate 210. For instance, the word lines 230 may be formed of a semiconductor layer doped with impurity ions or a metallic thin film, and the bit lines 295 may be formed of a metallic thin film.

A resistance-variable-material-layer may be provided between the word lines 230 and the bit lines 295 to carry out a memory or data storage function. The resistance-variable-material-layer may be a phase change material layer 280. The phase change material layer 280 corresponds to the resistance variable material illustrated in FIG. 6. The phase change material layer 280 may be formed of compound at least one of Te and Se of chalcogenide materials and at least one selected from Ge, Sb, Bi, Pb, Sn, Ag, S, Si, P, O, and C.

A lower electrode 275 and a selection device are provided between the phase change material layer 280 and the word line 230, and an upper electrode 290 is provided between the phase change material layer 280 and the bit line 295. The lower electrode 275 is electrically connected to the word line 230 via the selection device, for example, a diode 250. The upper electrode 290 is electrically connected to the bit line 295 through the selection device, for example, the diode 250.

The lower electrode 275 may be used as a heater to heat the phase change material layer 280. The lower electrode 275 and the upper electrode 290 may be formed of a metallic thin film, such as titanium nitride (TiN) or titanium aluminum nitride (TiAlN). According to this embodiment of the present general inventive concept, since the lower electrode 275 has L-shaped longitudinal cross-section surrounded by a third insulating layer 266 provided on the lower electrode 275 and the second insulating layer 260, it is possible to diminish a contact area with the phase change material layer 280, thereby reducing the reset current Ireset.

The lower electrodes 275 and phase change material layer 280 may be separated by a fifth insulation layer 262. The upper electrodes 290 and bit lines 295 may be separated from other upper electrodes 290 and bit lines 295, respectively, by a sixth insulation layer 263.

The selection device, that is, the diode 250, may include N-type semiconductor layer 251 and P-type semiconductor layer 252, which are stacked on the substrate 210, respectively. The P-type semiconductor layer 252 may directly contact the lower electrode 275, and the N-type semiconductor layer 251 may directly contact the word line 230. The lower electrode 275 and the phase change material layer 280 may be provided in the second insulating layer 260 and the third insulating layer 266. A silicide layer 253 may be further provided to reduce contact resistance between the diode 250 and the lower electrode 275.

In the cell array, a strapping word line (not illustrated) may be provided at an upper part of the bit line 295. The strapping word line is electrically connected to the word line 230 through a word line contact (indicated as 'WLC' in drawings) 235. The word line contact may include one or more metal studs 236, 237, and 238 connected between the word line 230 and an upper surface of the resistance-variable memory device.

FIGS. 8A through 8G are cross-sectional views illustrating a method of forming the resistance variable memory device according to the second embodiment of the present general inventive concept, respectively.

Figure 8A:
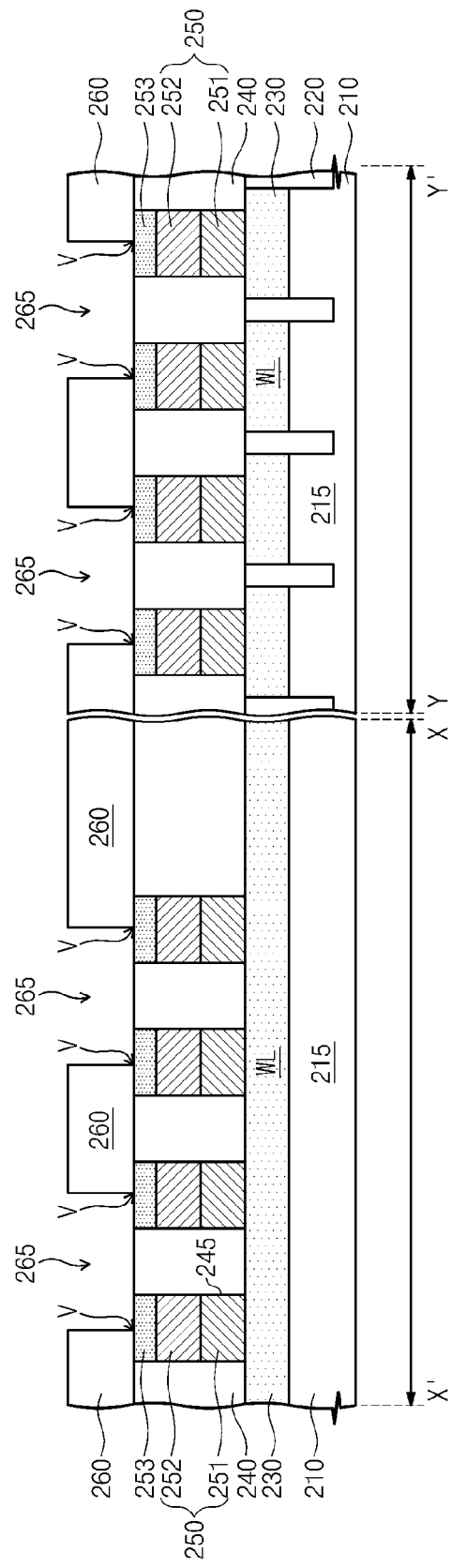

Referring to FIG. 8A, a substrate 210 is provided, and a device isolation layer 220 may be formed by processing the substrate 210 to define an active region 215. A plurality of word lines 230 may be formed on the substrate 210. The diode 250 may be formed on the word lines 230. A second insulating layer 260 may be formed by depositing an insulating material on the diode 250 and a first insulating layer 240 and patterning the diode 250 and the first insulating layer 240. The patterning process is patterned in a first direction and in a second direction intersecting the first direction and may form recessed regions 265 having the same shape as the region 'P' of FIG. 6. The region 'P' may be a shape in which each vertex 'V' of a transverse section of the recessed region 265 exists on the diode 250. This means that the vertexes 'V' of the transverse section of the recessed region 265 may be provided on the diode 150 adjacent to recessed region 265 regardless of shapes of the transverse section of the recessed region 265. The vertexes 'V' may be located at the center of the diode 250. Alternatively, the vertexes 'V' may be the same distance from the center of the diode 250. The region 'P' may be a square shape, as illustrated in FIG. 6, but is not limited thereto. Furthermore, the region 'P' may be a circle or oval. Alternatively, the line connecting vertexes together may be a curved shape.

Figure 8B:
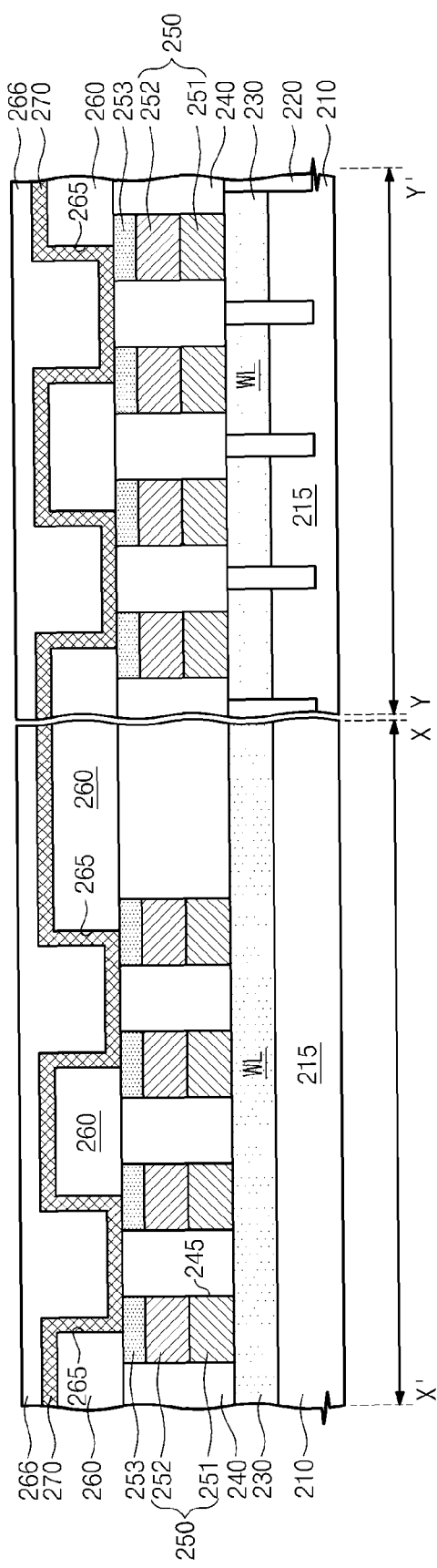

Referring to FIG. 8B, a conductive layer 270 may be formed on the recessed region 265 and the second insulating layer 260 that has a shape that corresponds or conforms to the shape of the recessed region 265. The conductive layer 270 may be formed of one or more transition metals, conductive transition metal nitrides, and conductive ternary nitrides. The conductive layer 270 may be formed by a sputtering or a Plasma-Enhanced Chemical Vapor Deposition (PECVD). A third insulating layer 266 may be provided on the conductive layer 270. After the third conductive layer 266 is formed, a Chemical-Mechanical Polishing (CMP) may further be provided.

Figure 8C:
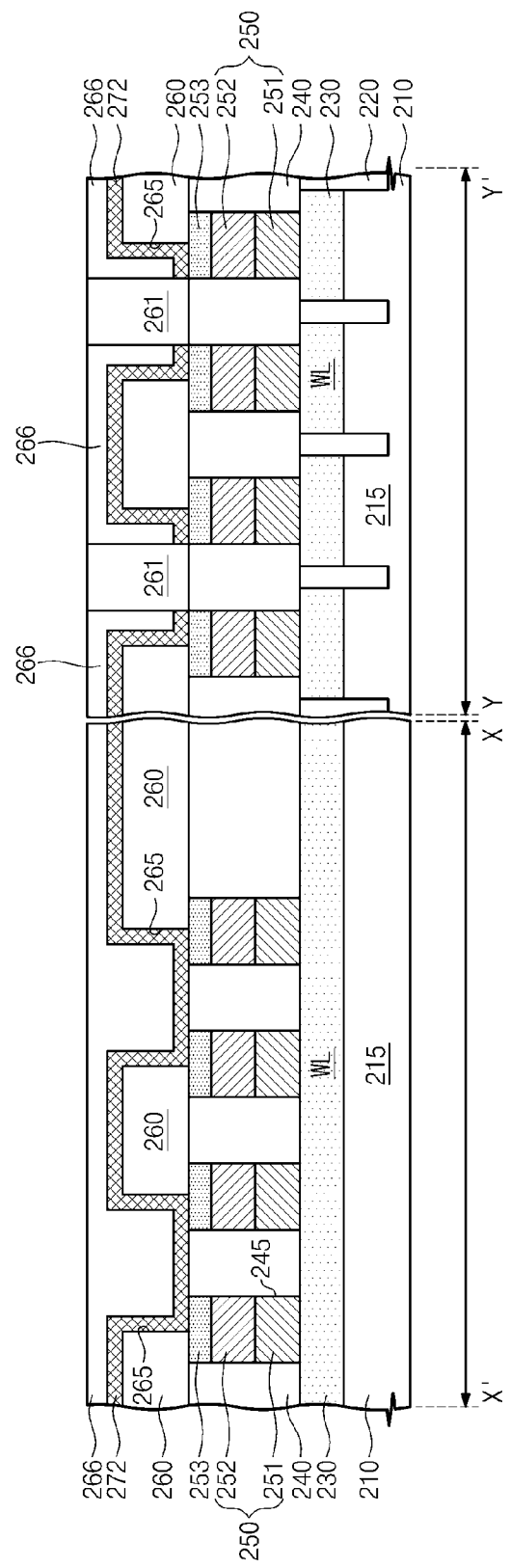

Referring to FIG. 8C, a preliminary conductive pattern 272 may be formed by patterning the conductive layer 270 and the third insulating layer 266 in a first direction. The first direction may be a direction parallel to the X-X direction. The patterning in the first direction means the process of patterning by a photo mask to have a repetitive pattern in a direction (Y-Y direction) perpendicular to the first direction. The patterning in the first direction may be a photolithography process. According to the second embodiment of the present general inventive concept, the preliminary conductive pattern 272 may repeatedly be formed per a pair of adjacent diodes by the patterning in the first direction. This results in overcoming the restriction of minimum pitch in a photolithogrpahic process. In addition, the patterning in the first direction may be performed by a fluorokrypton (KrF) laser. A fourth insulating layer 261 may be formed in the recessed region provided by the patterning in the first direction.

Figure 8D:
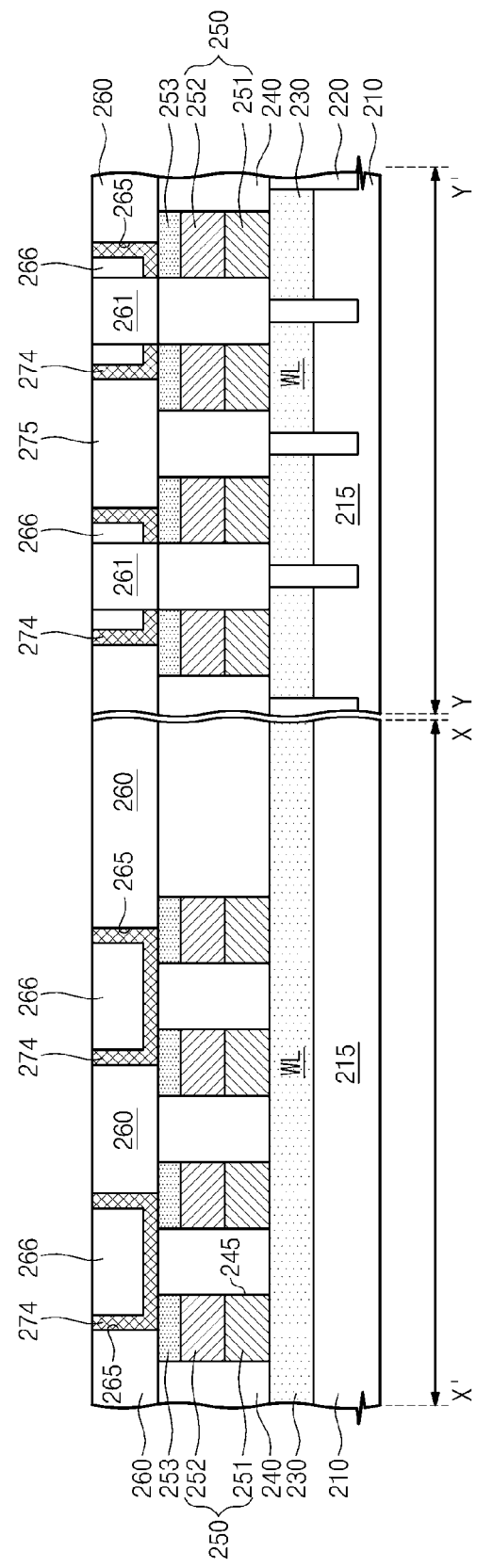

Referring to FIG. 8D, a chemical-mechanical polishing CMP process may be provided. By the CMP process, a conductive pattern 274 may be formed by separating the preliminary conductive pattern 272 per the pair of adjacent diodes 250.

Figure 8E:
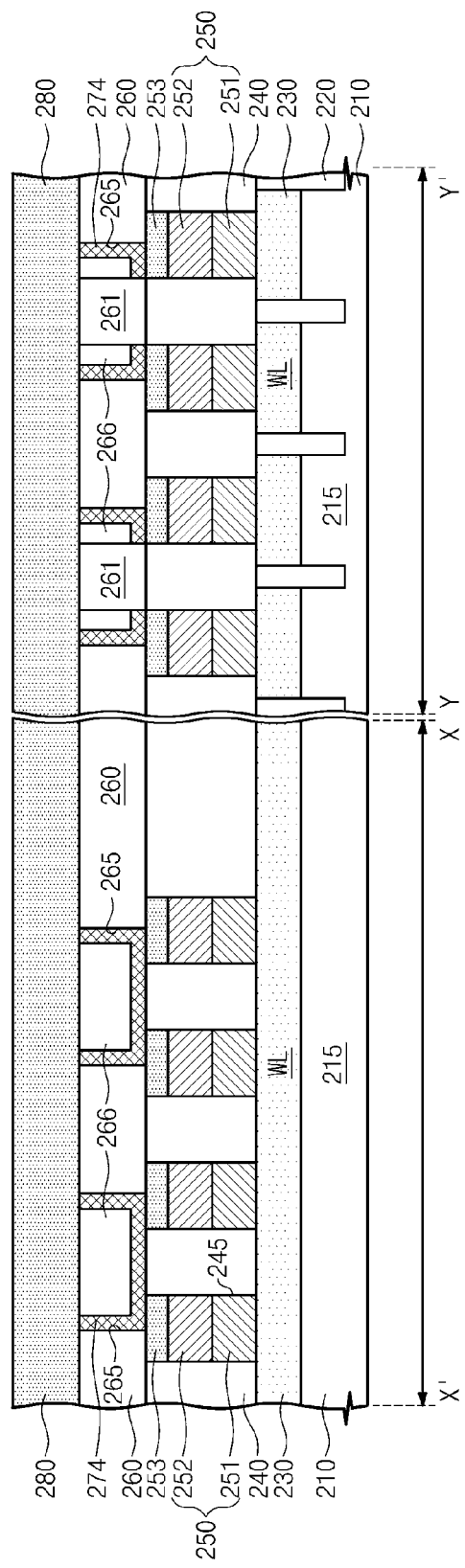

Referring to FIG. 8E, the resistance-variable-material-layer, for example, the phase change material layer 280 may be formed on the conductive pattern 274 and the insulating layers 260, 261, and 266. The phase change material layer 280 may be a material of which phases can reversely be changed. The phase change material layer 280 may be formed of compounds of at least one of Te and Se of chalcogenide materials and at least one selected from Ge, Sb, Bi, Pb, Sn, Ag, S, Si, P, O, and C.

Figure 8F:
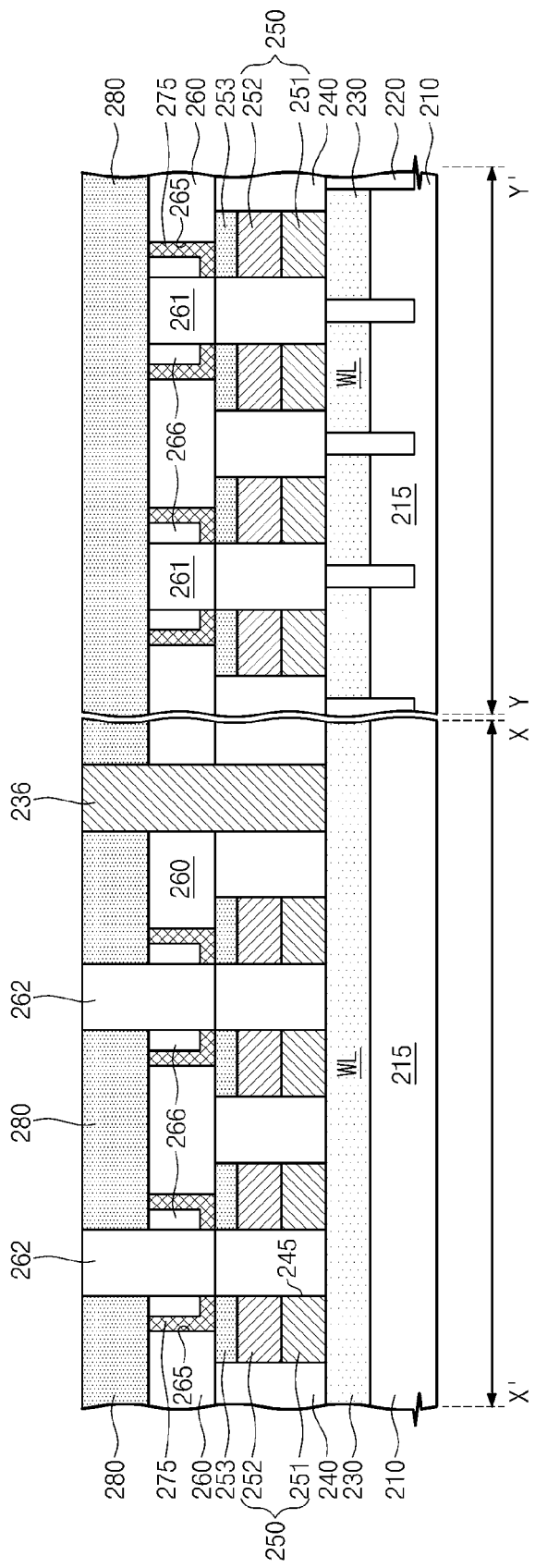

Referring to FIG. 8F, the phase change material layer 280 and the conductive layer 270 may be patterned in a second direction. The second direction may be a direction parallel to the Y-Y direction. The patterning in the second direction means the process of patterning by a photo mask to have a repetitive pattern in a direction (X-X direction) perpendicular to the second direction. The patterning in the second direction may be a photo process. By the patterning in the second direction, the lower electrode 275 may separately be formed on each diode 250. According to the second embodiment of the present general inventive concept, the lower electrode 275 may repeatedly be formed per a pair of adjacent diodes by the patterning in the second direction. This results in overcoming the restriction of minimum pitch according to a photo process. According to the second embodiment of the present general inventive concept, a fifth insulating layer 262 may be formed in the recessed region provided by the patterning in the second direction. A contact hole is formed by patterning the phase change material layer 280, the second insulating layer 260, and the first insulating layer 240. Subsequently, a lower metal stud 236 may be formed in the contact hold.

Figure 8G:
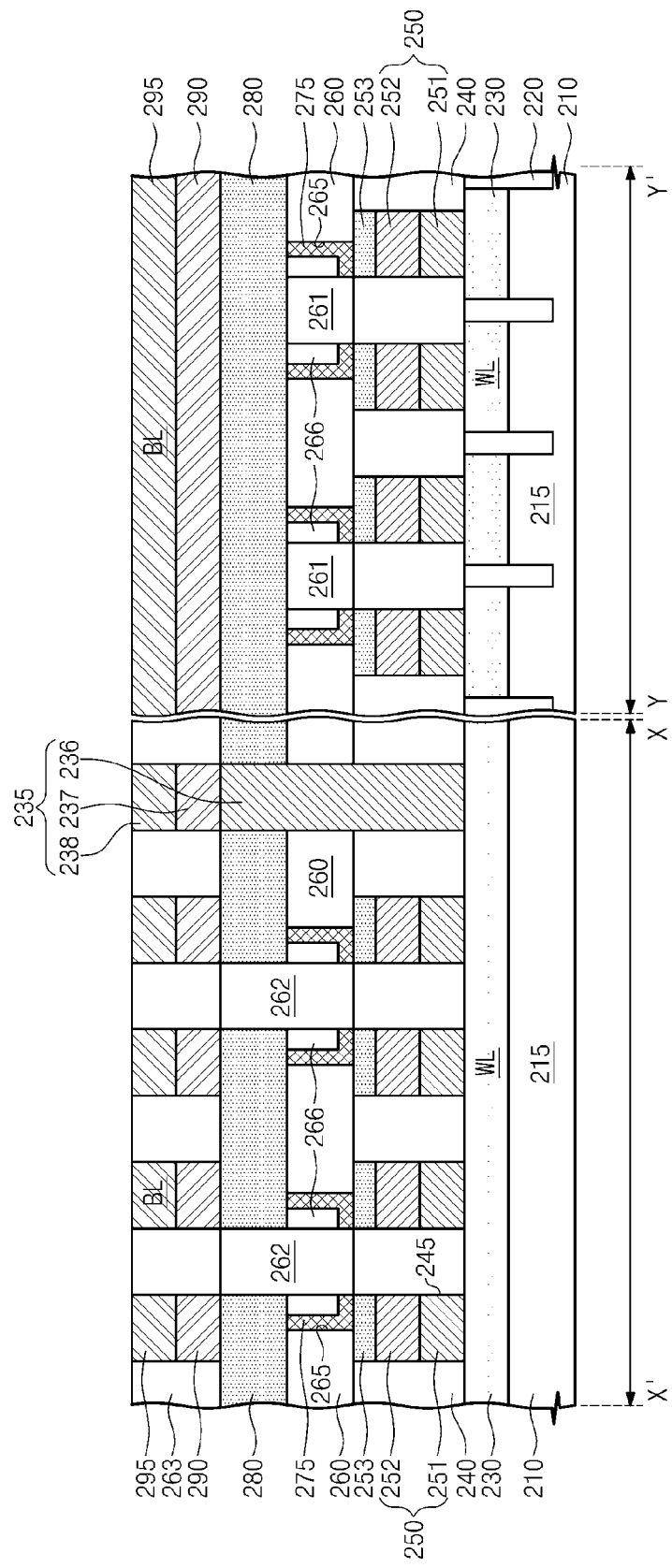

Referring to FIG. 8G, an upper electrode 290 and a bit line 295 may be formed on the phase change material layer 280. According to the second embodiment of the present general inventive concept, a sixth insulating layer 263 is formed on the phase change material layer 280 and the fourth insulating layer 262. After the sixth insulating layer 263 is patterned, the conductive layer, the upper electrode 290, and the bit line 295 may sequentially be formed. The upper electrode 290 may have the same material as the lower electrode 275. The bit line 295 may be formed of a metallic thin film. According to the second embodiment of the present general inventive concept, the bit line 295 may be formed by a sputtering. In addition, an upper metal stud 238 and a middle metal stud 237 may be formed in the same manners as described above.

The memory device according to the second embodiment of the present general inventive concept further diminishes the contact area between the phase change material layer 280 and the lower electrode 275, thereby reducing still more the reset current Ireset.

Figure 9:
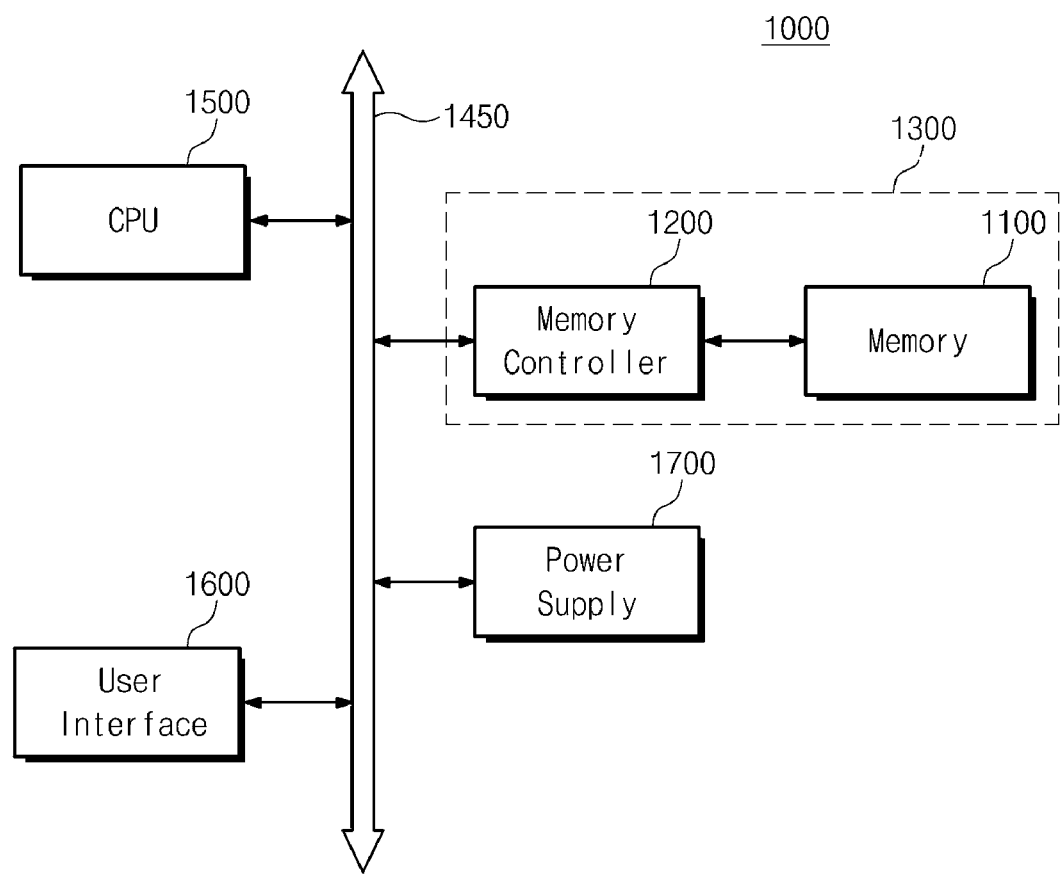
FIG. 9 is a block diagram of a memory system illustrating an applicable example of the resistance variable memory device according to embodiments of the present general inventive concept.

FIG. 9 is a block diagram of a memory system illustrating an applicable example of the resistance variable memory device according to embodiments of the present general inventive concept.

Referring to FIG. 9, a memory system 1000 includes a semiconductor memory device 1300 composed of a resistance variable memory device (for example, PRAM) 1100 and a memory controller 1200, a central processing unit 1500, a user interface 1600, and power supply unit 1700 that are electrically connected to a system bus 1450, respectively.

Data are provided through the user interface 1600 or processed by the central processing unit 1500. The data are stored in the resistance variable memory device 1100 through the memory controller 1200. The resistance variable memory device 1100 may be a semiconductor disk device (SSD). In this case, the memory system 1000 may significantly prompt in write speed.

Although not illustrated in FIG. 9, it will be apparent to those skilled in the art that an application chipset, a Camera Image Processor (CIS), a mobile DRAM and so on may further be provided to the memory system 1000 according to the embodiments of the present general inventive concept.

In addition, the memory system 1000 may be applicable to a PDA, portable computer, web tablet, wireless phone, mobile phone, digital music player, memory card, or all of devices capable of transmitting and/or receiving information in wireless environment.

Furthermore, the resistance variable memory device or the memory system according to the embodiments of the present general inventive concept may be mounted in various types of packages. For example, the resistance variable memory device or the memory system may be packaged and mounted in such manners as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

According to the embodiments of the present general inventive concept, since the conductive layer is formed and patterned on a plurality of selection devices, it can overcome the restriction of the minimum pitch of photolithographic processes and make the reset current smaller by making the contact area between an electrode and the resistance-variable material layer smaller.

Although a few embodiments of the present general inventive concept have been shown and described, it would be appreciated by those skilled in the art that changes may be made in these embodiments without departing from the principles and spirit of the general inventive concept, the scope of which is defined in the claims and their equivalents.

What is claimed is:

1. A method of fabricating a resistance-variable memory device, the method comprising:
    forming a plurality of selection devices on a substrate;
    forming a first insulating layer including one recessed region which exposes four adjacent selection devices;
    forming a conductive layer on the selection devices and the first insulating layer;
    patterning the conductive layer in a first direction to form conductive patterns spaced apart from each other and connecting a pair of adjacent selection devices to each other in the first direction;
    forming a resistance-variable material layer on the conductive patterns; and
    patterning the resistance-variable-material-layer and the conductive patterns in a second direction to form rows of resistance-variable material extending in the second direction and to form lower electrodes spaced apart from one another, such that each lower electrode corresponds to a separate selection device.

2. The method according to claim 1, wherein the lower electrodes are disposed in the recessed region and in contact with the upper surfaces of the selection devices, respectively.

3. The method according to claim 2, wherein the conductive layer fills the recessed region,
    patterning the conductive layer comprises exposing a second insulation layer between the plurality of selection devices and leaving portions of the conductive layer at locations corresponding to the upper surfaces of the selection devices, and
    the method further comprises forming a third insulation layer between remaining portions of the conductive layer.

4. The method according to claim 2, wherein the conductive layer is formed on a bottom and sides of the recessed region to conform to a shape of the bottom and sides of the recessed region,
    patterning the conductive layer comprises exposing a second insulation layer between the plurality of selection devices and leaving portions of the conductive layer at locations corresponding to the upper surfaces of the selection devices, and
    the method further comprises forming a third insulation layer between the remaining portions of the conductive layer.

5. The method according to claim 4, wherein the lower electrodes have an "L" cross-section shape in corners of the recessed region corresponding to the upper surfaces of the plurality of selection devices.

6. The method according to claim 2, wherein the recessed region has a polygonal shape having corners corresponding to center portions of upper surfaces of the plurality of selection devices.

7. The method according to claim 6, wherein the selection devices are arranged on the substrate in a grid pattern including rows and columns, and
    the recessed region is formed to have polygonal shapes having corners corresponding to the center portions of the upper surfaces of the plurality of diodes in first and second adjacent columns of selection devices.

8. The method according to claim 7, wherein the lower electrodes are disposed in the corners of the recessed region, the method further comprising:
    forming a second insulation layer to contiguously fill the recess,
    wherein the variable-resistance material layer is formed to contact upper surfaces of selection devices in the second column of selection devices and a third column of selection devices adjacent to the second column and different from the first column.

9. The method according to claim 1, further comprising:
    forming the plurality of upper electrodes on the resistance variable material to electrically connect to the resistance-variable material,
    wherein the plurality of upper electrodes comprises a plurality of rows on an upper surface of the resistance-variable material layer, each row corresponding to a row of the plurality of selection devices.

10. The method according to claim 9, further comprising:
    forming a plurality of conductive word lines on the substrate and forming the plurality of selection devices on the plurality of conductive word lines,
    wherein the plurality of upper electrodes extends perpendicular to the plurality of conductive word lines.

11. The method according to claim 10, further comprising:
    forming a plurality of conductive bit lines on the plurality of upper electrodes, the plurality of conductive bit lines formed in rows on the plurality of upper electrodes to correspond to the rows of the plurality of selection devices.

12. The method according to claim 11, further comprising:
    forming an insulation layer to separate each bit line from each other bit line and each upper conductive electrode from each other upper conductive electrode.

13. The method according to claim 12, further comprising:
    forming a plurality of word line contacts to extend from an upper surface of a respective word line to an upper surface of the resistance-variable memory device.

* * * * *